United States Patent [19]

Borodin et al.

[11] Patent Number: 5,069,744
[45] Date of Patent: Dec. 3, 1991

[54] PROCESS FOR PRODUCING SINGLE CRYSTALS OF OPTICAL CALCITE

[76] Inventors: Vadim L. Borodin, Ulitsa Oktyabrskaya, 4,kv.134; Valery V. Dronov, Ulitsa Gagarina, 17,kv.94; Valentin E. Khadzhi, ulitsa Institutskaya, 14,kv.8, all of Alexandrov, U.S.S.R.

[21] Appl. No.: 595,308

[22] Filed: Oct. 10, 1990

[30] Foreign Application Priority Data

Oct. 26, 1989 [SU] U.S.S.R. ............................. 4750251

[51] Int. Cl.[5] ............................................... C30B 7/10
[52] U.S. Cl. ............................. 156/623 R; 156/621; 156/623 Q
[58] Field of Search ................. 156/621, 623 Q, 623 R

[56] References Cited

U.S. PATENT DOCUMENTS 3,253,893  5/1966  Sawyer ........................... 156/623 R
3,291,575 12/1966  Sawyer ........................... 156/623 Q
4,762,588  8/1988  Hirano et al. .................... 156/623 R

FOREIGN PATENT DOCUMENTS 2404559  8/1975  Fed. Rep. of Germany ... 156/623 Q

OTHER PUBLICATIONS

Kinloch et al., J. Crystal Growth 24/25 (1974) pp. 610–613.

Primary Examiner—Robert Kunemund
Assistant Examiner—Felisa Garrett
Attorney, Agent, or Firm—Burgess, Ryan & Wayne

[57] ABSTRACT

A process is provided for producing single crystals of optical calcite by a hydrothermal method and comprises heating crystalline calcium carbonate, then crystalline calcium carbonate is recrystallized onto one seed plate arranged vertically in an insertion container and having its side surfaces screened, a temperature difference existing between the zones of location of the calcium carbonate and of the seed plate, ranging within 2 to 4 K.

3 Claims, 1 Drawing Sheet

PROCESS FOR PRODUCING SINGLE CRYSTALS OF OPTICAL CALCITE

BACKGROUND OF THE INVENTION

1. Field of the Invention

The present invention relates to the art of growing single crystals and more particularly to producing single crystals of optical calcite.

The crystals produced in accordance with the process proposed herein, due to their high birefringence, find extensive application as a material for manufacturing polarizers of light, beam-diverging elements and, high-speed laser shutters.

2. Background Art

Known in the art is a process for producing single crystals of calcite under hydrothermal conditions in solutions of alkali metal chlorides and ammonia with the use of a glass insertion container at a temperature of 423–478K, a pressure of 15–25 MPa, temperature difference of 10–25K (N.Yu. Ikornikova et al., "Rost cristallow" ('Growth of Crystals'), 1961, vol. 4, Nauka Publishers, (Moscow), pp. 92–94), wherein the growth of crystals of calcite by a hydrothermal method is effected on seed plates arranged in the upper portion of an insertion container by virtue of supplying through the agency of thermal convection a saturated solution from the bottom portion of said container, wherein a batch material in the form of fragments of calcite crystals is disposed. Mass transfer occurs due to the creation of a temperature difference between the zones of the growth of crystals and the zone of disposition of crystalline calcium carbonate.

With the use of the prior-art process it is impossible to produce large single crystals of optical quality (with the thickness of the build-up of 12 mm and over) because of a reduction of the growth rate and formation of defects in the built-up layer in long-term cycles of crystallization.

Also known is a process of producing single crystals of calcite (Genet F. et al., High Temperatures-High Pressures. 1974, pp. 657–662), comprising recrystallization from solutions of $NH_2Br$ at a growth temperature higher than 553K, at a pressure over 12 MPa, and at a temperature gradient over 5K.

In the course of heating an autoclave in a hydrothermal system due to hydrolysis of the solvent and dissolution of $CaCO_3$ a gaseous phase is formed, consisting of $CO_2$, $NH_3$, $H_2$. The presence of the gaseous phase leads to a spontaneous inventive nucleation of crystals, which hinders the deposition of the material on seed plates.

The growth of freely suspended seed plates is realized due to the formation of pyramids (build-up) sectors of all the faces that are possible under given physico-chemical conditions. Therefore, boundaries of the growth sectors are formed in the crystals, these boundaries being manifest as striae-like defects. These areas of the crystal, which occupy up to 50% of the volume of the built-up crystalline material, are rejected in the manufacture of optical elements. Monoblocks of crystals are considered to be good, if they contain no striae-like defects associated with the boundaries of the growth sectors. The growth of crystals is realized on freely suspended seed plates, i.e. the resulting crystals are composed of 6 pyramids (sectors) of the growth of faces of a cleavage rhombohedron (10–11). Therefore, boundaries of the growth sectors are formed in the crystals, these boundaries being optical defects which have to be rejected in the manufacture of optical elements. Only two pyramids of the growth of crystals, defined by the faces having a maximal surface area can be used effectively. For this reason, the prior-art process does not provide the obtaining of crystals with a maximal optically good monoarea.

Realization of the given process in long-term cycles of crystallization (over 100 days), required for producing large crystals suitable for industrial use, leads to slowing down and then to a complete inhibition of the growth of optical-quality crystals. This occurs due to the fact that in long-term cycles of crystallization there take place a considerable reduction of the surface of the dissolving solid phase and a considerable increase of the surface of growing crystals both because of expansion of the seed plates and because of an intensive growth of spontaneous-nucleation crystals. The formation of spontaneous-nucleation crystals is favoured by the origination of a gaseous phase in the course of the autoclave heating in the hydrothermal system due to hydrolysis of the solvent and dissolution of $CaCO_3$.

SUMMARY OF THE INVENTION

It is an object of the present invention to raise the process efficiency and to increase the yield of good crystals.

The essence of the invention resides in a process for producing single crystals of calcite by a hydrothermal method in an insertion container filled with an aqueous solution of ammonium halide and arranged in an autoclave, comprising crystalline calcium carbonate and at least one seed plate are disposed in the insertion container, the crystalline calcium carbonate is heated, then the crystalline calcium carbonate is recrystallized from the aqueous solution of ammonium halide onto at least one seed plate with a temperature difference existing between the zones of location of the calcium carbonate and of at least one seed plate in the insertion container, according to the invention, at least one seed plate is arranged vertically, the side surfaces of the seed plate are screened by means of screens arranged vertically and symmetrically, the planes of the screens being parallel to each other and perpendicular to the plane of the seed plate, the recrystallization of the crystalline calcium carbonate being effected at a temperature difference between the zones of location of the calcium carbonate and of at least one seed plate ranging within 2 to 4K.

It is expedient that the autoclave should be filled with a solution of an alkali and that the coefficients of filling of the insertion container and of the autoclave should be so as to provide an excessive pressure in the insertion container during the process of heating and of the removal of the gaseous phase therefrom, said gaseous phase having been formed as a result of dissolution of the crystalline calcium carbonate in the solution of ammonium halide.

It is expedient that the screens should be arranged symmetrically and that the planes of the screens should be disposed parallel to each other and perpendicularly to the plane of the seed plate.

The use of the present invention enables industrial production of single crystals of optical calcite (calcium carbonate), the physical characteristics and dimensions of said crystals being adequate for manufacturing polarization prisms, and laser shutters, which are widely used in such fields as optical fibre communications, and laser technology.

BRIEF DESCRIPTION OF DRAWINGS

The present invention will be better understood from its exemplary embodiments presented hereinbelow by way of illustration and from the accompanying drawings, in which.

DETAILED DESCRIPTION OF THE INVENTION

Figure 1:
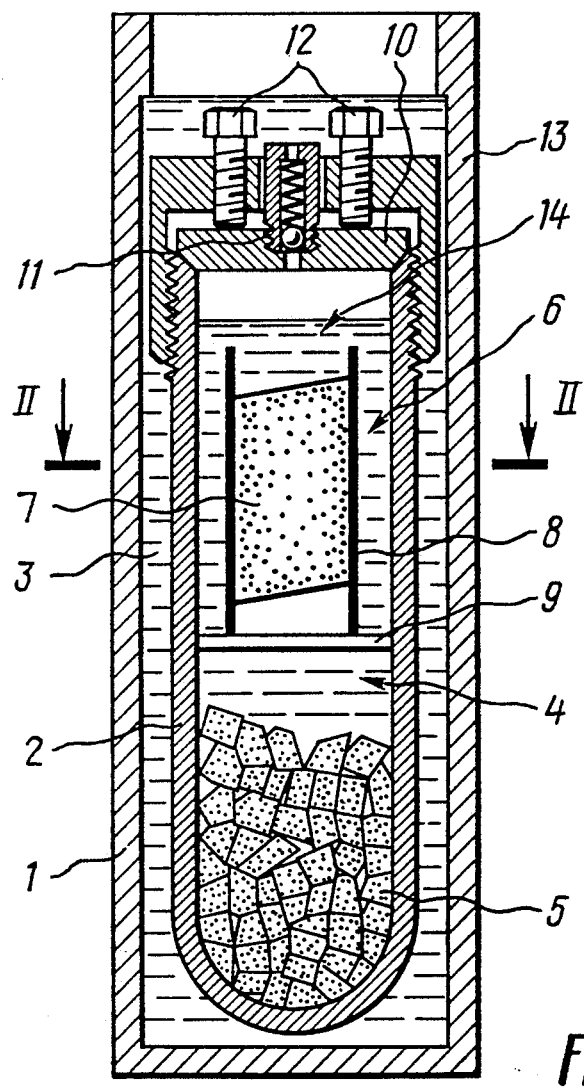
FIG. 1 is a cross-sectional view of a device for growing single crystals of optical calcite, according to the invention.

Single crystals of optical calcium carbonate (calcite) are grown under hydrothermal conditions by virtue of dissolution of fine-crystalline calcium carbonate or of fragments of the crystals of natural optical calcite, placed into a bottom part of an insertion container, in solutions of ammonium halides at high temperatures and pressures, subsequent mass transfer through the agency of thermal convection of a saturated solution to the upper part of the insertion container, and deposition of calcium carbonate on seed plates manufactures from natural single crystals of optical-grade calcite. The seed plates are secured in the upper part of the insertion container by means of a holder and are separated from the initial crystalline calcium carbonate by a diaphragm to create a temperature difference.

A device for growing single crystals of optical calcite, in which the herein-proposed process is realized, comprises an autoclave 1 (FIG. 1) with an insertion container 2 arranged coaxially there-inside with a clearance, filled with an aqueous solution 3 of an alkali. The insertion container 2 comprises a zone 4 for locating calcium carbonate 5 and a zone 6 for locating at least one seed plate 7, defined by vertically arranged screens 8. The zones 4 and 6 are separated by a partition 9. The insertion container 2 is provided with a cover 10 for tightening thereof, with a valve 11 and fixing elements 12, 13. The insertion container 2 is filled with a solution 14. FIG. 2 shows a crystal 15 of optical calcite, grown in accordance with the process proposed herein.

The present process of producing single crystals of optical calcite comprises the process of growth of single crystals 15 (FIG. 2) and which is effected at a temperature difference between the zones 4, 6 (FIG. 1) adapted to locate crystalline calcium carbonate 5 and at least one seed plate 7, ranging within 2 to 4K. The use of the temperature difference equal to 2-4K makes it possible to obviate lowering of the growth rate and development of faults in the crystals of calcite in long-term cycles of crystallization, to obtain optical-grade crystals with the thickness of the built-up layer of 12 mm and higher, due to the retaining of an optimal ratio of the surfaces of the dissolving and growing solid phases. If the temperature difference is greater than 4K, a defective built-up layer is formed in the crystals at the final stages of their growth. If the temperature difference is less than 2K, the rate of the growth of the crystals on at least one seed plate 7 becomes low and the process becomes economically ineffective.

Figure 2:
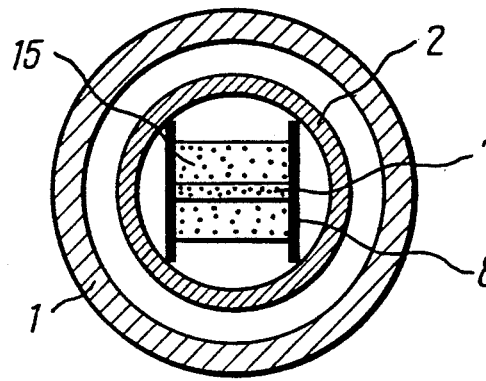
FIG. 2 is a section taken along II—II in FIG. 1.

The growth of the crystals 15 of calcite is carried out of lamellar seed plates 7 arranged in the insertion container 2 (FIG. 1). The side surfaces of the plates 7 are defined by screens 8. In this case no build-up sectors from the end faces are formed, and, consequently, boundaries of the growth sectors are also absent, which otherwise give optical defects, so that crystals with a maximal optically good mono-area can be produced and the yield of good crystals is thus increased.

A characteristic feature of the herein-proposed process is also that the gaseous phase formed during the heating is bled off. Due to this the mass of spontaneously formed crystals diminishes, that is, the effectiveness of the process of the growth of crystals on the seed plates is increased.

The gaseous phase is bled off through the valve 11 installed in the upper cover 10 of the insertion container 2 into the space between the internal wall of the autoclave 1 and the external surface of the insertion container 2, filled with an aqueous solution 3 of an alkali. This technological procedure makes it possible to protect the walls of the steel autoclave 1 from corrosion with products which evolve from the insertion container 2 when the valve 11 is opened and whose reaction is acidic. Bleeding off of the gaseous phase is performed at an excessive initial coefficient of filling of the insertion container in relation to the filling of the autoclave 1 in the process of its warming up. This precludes contamination of the hydrothermal solution inside the insertion container 2 with the alkaline solution from the space around it.

Given hereinbelow is an example of embodying the herein-proposed process of producing single crystals of optical calcite.

EXAMPLE

A charge in the form of fragments of crystals of natural Iceland spar was loaded into the bottom part (dissolution chamber) of a corrosion-resistant insertion container 1 having a capacity of 200 l. In the upper part (growth chamber) of the insertion container seed plates were arranged vertically, said plates 7 being parallel to the faces of a cleavage rhombohedron (10-11). A partition 9, made as a perforated disk, was disposed between the dissolution chamber and the growth chamber. An aqueous solution of $NH_4Br$ (8 mass %) was poured into the insertion container 2 so that the coefficient of filling its free space should be 0.85. The insertion container 2 was closed with a cover 10 provided with a valve 11 and after that it was placed into a stell autoclave 1 having a capacity of 1500 l. The free space of the autoclave was filled with a 1% aqueous solution of an alkali (NaOH), the coefficient of filling being 0.84. The autoclave 1 was made tight and heated with the aid of external and internal thermoelectric heaters (not shown in the Figure). The temperature was measured with two Chromel-Copel thermocouples placed into a tubular protective pocket disposed in the space between the external wall of the insertion container 2 and the wall of the autoclave 1. During the experiment the temperature in the growth chamber was set to be 553K, the temperature in the dissolution chamber was set to be 558K, the temperature difference was 5K, the pressure in the autoclave was set to be 85 MPa, the duration of the experiment was 200 days. A series of experiments under different conditions was conducted in a similar manner.

The conditions and results of the experiments on growing crystals of calcite are presented in the table hereinbelow.

The crystals, in spite of a sufficient thickness of the built-up layer (equal on an average to 18 mm), have zones of defective ("skeleton") growth in their near-surface part, this being indicative of "starvation" of the crystals during the last half of the cycle. Apparently, this is caused by the ratio of the surfaces of the dissolving and growing phases becoming lower than the critical value. An average thickness of the homogeneous (defect-free) built-up layer is 8 mm.

As it follows from the table, the herein-proposed improvements in the process ensure continuous defect-free growth of crystals on the seed plates 7 in long-term cycles with a drastic reduction of spontaneous nucleation, and also increase the yield of good crystals.

The application of the present invention will make it possible to grow sufficiently large crystals, suitable for industrial use.

TABLE

Conditions for growing of crystals

| Experiment, No. 1 | T of dissolution, K 2 | ΔT, K 3 | P, MPa 4 | Bleeding off of gas 5 | Screening of seed plate 6 |
|---|---|---|---|---|---|
| 1 | 558 | 5 | 85 | yes | yes |
| 2 | 557 | 4 | " | " | " |
| 3 | 556 | 3 | " | " | " |
| 4 | 555 | 2 | " | " | " |
| 5 | 554 | 1 | 80 | " | " |
| 6 | 556 | 3 | 85 | no | " |
| 7 | 556 | 3 | " | yes | no |
| 8 | 556 | 3 | " | no | yes |

Results of experiments

| Experiment, No. | Average thickness of homogeneous built-up layer, mm | Yield of good crystals, % | Rate of homogeneous growth of crystals, mm/day |
|---|---|---|---|
| 1 | 8 | 4 | 0.040 |
| 2 | 14 | 30 | 0.070 |
| 3 | 15 | 36 | 0.075 |
| 4 | 12 | 33 | 0.060 |
| 5 | 4 | 2 | 0.020 |
| 6 | 10 | 12 | 0.050 |
| 7 | 14 | 15 | 0.070 |
| 8 | 9 | 5 | 0.045 |

What is claimed is:

1. A process for producing single crystals of optical calcite by a hydrothermal method in an insertion container filled with an aqueous solution of ammonium halide and arranged in an autoclave, comprising the steps of:
   1) locating crystalline calcium carbonate and at least one seed plate in said insertion container;
   2) arranging at least one seed plate vertically in the insertion container above said crystalline calcium carbonate which is located in the lower part of the insertion container;
   3) screening the side surfaces of said seed plate by means of vertically arranged screens;
   4) hermetically sealing the insertion container and autoclave;
   5) heating the autoclave and insertion container to a temperature of hydrothermal synthesis;
   6) maintaining the pressure in the insertion container and autoclave within 80–85 MPa; and
   7) conducting hydrothermal synthesis in which recrystallization is effected of said calcium carbonate from the ammonium halide aqueous solution on at least one seed plate with the presence of a temperature drop between the zones of location of calcium carbonate and at least one said seed plate equal to the range of T2–3K.

2. A process for producing single crystals of optical calcite by a hydrothermal method in an insertion container filled with an aqueous solution of ammonium halide and arranged in an autoclave, comprising the steps of:
   1) locating crystalline calcium carbonate and at least one seed plate in said insertion container;
   2) arranging at least one seed plate vertically in the insertion container above said crystalline calcium carbonate which is located in the lower part of the insertion container;
   3) screening the side surfaces of said seed plate by means of vertically arranged screens;
   4) hermetically sealing the insertion container and autoclave;
   5) heating the autoclave and insertion container to a temperature of hydrothermal synthesis;
   6) maintaining the pressure in the insertion container and autoclave within 80–85 MPa; and
   7) conducting hydrothermal synthesis in which recrystallization is effected of said calcium carbonate from the ammonium halide aqueous solution on at least one seed plate with the presence of a temperature drop between the zones of location of calcium carbonate and at least one said seed plate equal to the range of T 2–3K, and
   wherein prior to hermetically sealing said insertion container and autoclave, the space of said autoclave, free of the insertion container placed therein, is filled with an alkali solution which is carried out with a coefficient of filling the insertion container with an aqueous solution of ammonium halide and crystalline calcium carbonate and the autoclave with the alkali solution, so as to create an excess pressure in said insertion container during heating and removing a gas phase therefrom, which is formed as a result of dissolving the crystalline calcium carbonate in said ammonium halide solution.

3. A process as claimed in claim 1, in which the hydrothermal synthesis is conducted at a temperature between about 554 and about 558K.

* * * * *